United States Patent
Suh et al.

(10) Patent No.: US 11,039,401 B2
(45) Date of Patent: Jun. 15, 2021

(54) ELECTRONIC DEVICE AND METHOD FOR ADJUSTING ELECTRICAL LENGTH OF RADIATING PORTION

(71) Applicant: Samsung Electronics Co., Ltd., Gyeonggi-do (KR)

(72) Inventors: Young Hoon Suh, Gyeonggi-do (KR); Youn Seop Kim, Seoul (KR); Yo Han Moon, Seoul (KR)

(73) Assignee: Samsung Electronics Co., Ltd

( * ) Notice: Subject to any disclaimer, the term of this patent is extended or adjusted under 35 U.S.C. 154(b) by 303 days.

(21) Appl. No.: 15/892,072

(22) Filed: Feb. 8, 2018

(65) Prior Publication Data

US 2018/0227858 A1   Aug. 9, 2018

(30) Foreign Application Priority Data

Feb. 8, 2017   (KR) ........................ 10-2017-0017727

(51) Int. Cl.
*H04W 52/24* (2009.01)
*H01Q 5/335* (2015.01)
(Continued)

(52) U.S. Cl.
CPC .......... *H04W 52/241* (2013.01); *H01Q 1/243* (2013.01); *H01Q 5/328* (2015.01); *H01Q 5/335* (2015.01); *H03H 7/40* (2013.01)

(58) Field of Classification Search
CPC ..... H04W 52/241; H01Q 5/328; H01Q 5/335; H01Q 1/243; H01Q 1/36; H01Q 1/48; H01Q 3/24; H01Q 23/00; H03H 7/40
See application file for complete search history.

(56) References Cited

U.S. PATENT DOCUMENTS

| | | |
|---|---|---|
| 7,072,620 B2 | 7/2006 | Tran |
| 7,358,908 B2 | 4/2008 | Tran |

(Continued)

FOREIGN PATENT DOCUMENTS

| | | |
|---|---|---|
| CN | 1774837 | 5/2006 |
| CN | 103296384 | 9/2013 |

(Continued)

OTHER PUBLICATIONS

European Search Report dated Jun. 15, 2018 issued in counterpart application No. 18155049.2-1205, 7 pages.

(Continued)

*Primary Examiner* — Ankur Jain
(74) *Attorney, Agent, or Firm* — The Farrell Law Firm, P.C.

(57) ABSTRACT

Disclosed is an electronic device including an antenna including a radiating portion and a feeding portion connected to the radiating portion; a tunable element electrically connected to the radiating portion and configured to influence an electrical length of the radiating portion with respect to a specified frequency; an amplifier electrically connected to the feeding portion and configured to amplify a signal to be transmitted to an external electronic device through the radiating portion; and a control circuit electrically connected with the antenna, the tunable element, and the amplifier. The control circuit is configured to determine strength of a signal reflected from the radiating portion while the signal is transmitted to the external electronic device through the radiating portion; and adjust a value of the tunable element to reduce the strength of the reflected signal.

10 Claims, 11 Drawing Sheets

(51) Int. Cl.
  *H01Q 1/24* (2006.01)
  *H03H 7/40* (2006.01)
  *H01Q 5/328* (2015.01)

(56) References Cited

U.S. PATENT DOCUMENTS

| | | | |
|---|---|---|---|
| 7,671,804 | B2 | 3/2010 | Zhang et al. |
| 8,125,399 | B2 | 2/2012 | McKinzie et al. |
| 8,269,683 | B2 | 9/2012 | McKinzie et al. |
| 8,405,563 | B2 | 3/2013 | McKinzie et al. |
| 8,626,083 | B2 | 1/2014 | Greene et al. |
| 8,929,227 | B2 | 1/2015 | Lee et al. |
| 9,054,756 | B2 | 6/2015 | See et al. |
| 9,368,869 | B2 | 6/2016 | Chen et al. |
| 9,413,065 | B2 | 8/2016 | Caimi et al. |
| 9,557,409 | B2 * | 1/2017 | Ferguson ............... G01S 13/882 |
| 9,559,434 | B2 | 1/2017 | Lahti et al. |
| 2004/0246189 | A1 * | 12/2004 | Tran ....................... H01Q 9/145 |
| | | | 343/703 |
| 2007/0285326 | A1 * | 12/2007 | McKinzie ............ H01Q 9/0407 |
| | | | 343/746 |
| 2009/0028074 | A1 * | 1/2009 | Knox ................... H01Q 9/0435 |
| | | | 370/278 |
| 2010/0085260 | A1 | 4/2010 | McKinzie et al. |
| 2012/0157026 | A1 | 6/2012 | McKinzie et al. |
| 2012/0176915 | A1 | 7/2012 | Lee et al. |
| 2012/0188917 | A1 * | 7/2012 | Knox ................... H01Q 1/2225 |
| | | | 370/277 |
| 2012/0295555 | A1 * | 11/2012 | Greene ................ H04B 1/0458 |
| | | | 455/77 |
| 2014/0306859 | A1 | 10/2014 | Desclos et al. |
| 2015/0118974 | A1 | 4/2015 | Montgomery et al. |
| 2018/0159222 | A1 * | 6/2018 | Backes .................. H01Q 5/335 |

FOREIGN PATENT DOCUMENTS

| | | |
|---|---|---|
| CN | 103546188 | 1/2014 |
| CN | 103828247 | 5/2014 |
| CN | 104104405 | 10/2014 |
| CN | 105703785 | 6/2016 |
| KR | 20020000328 | 1/2002 |
| KR | 1020120080327 | 7/2012 |

OTHER PUBLICATIONS

Chinese Office Action dated Feb. 18, 2021 issued in counterpart application No. 201810123365.1, 20 pages.

* cited by examiner

ELECTRONIC DEVICE AND METHOD FOR ADJUSTING ELECTRICAL LENGTH OF RADIATING PORTION

PRIORITY

This application claims priority under 35 U.S.C. § 119(a) to Korean Patent Application Serial No. 10-2017-0017727, which was filed in the Korean Intellectual Property Office on Feb. 8, 2017, the entire content of which is incorporated herein by reference.

BACKGROUND

1. Field of the Disclosure

The present disclosure relates generally to a technology of tuning an antenna included in an electronic device.

2. Description of Related Art

Wireless communication technology makes it possible to transmit and receive various forms of information such as text, an image, a video, voice, etc. The wireless communication technology is being developed to transmit and receive information at faster rates. With the advancement of wireless communication technology, an electronic device, such as a smartphone or tablet, may provide a service using a communication function such as digital multimedia broadcasting (DMB), global positioning system (GPS), wireless-fidelity (Wi-Fi), long-term evolution (LTE), near field communication (NFC), magnetic stripe transmission (MST), etc. To provide such a service, the electronic device may include one or more antennas. The antenna may include a radiating portion configured to radiate a communication signal and a tunable element configured to adjust an electrical length of the radiating portion.

An electronic device including an antenna may tune an element connected with a radiating portion in terms of impedance matching to improve the radiation performance of the antenna. For example, the electronic device may perform impedance matching by tuning the element based on a look-up table, which is previously stored, if impedance is mismatched. However, in various models of electronic devices, it is difficult to create a look-up table suitable for each model. In addition, the impedance matching based on the look-up table may be unable to provide the optimal matching value.

SUMMARY

Aspects of the present disclosure are to address at least the above-mentioned problems and/or disadvantages, and to provide at least the advantages described below. Accordingly, an aspect of the present disclosure is to provide an electronic device, capable of tuning an antenna to improve radiation efficiency for a specified frequency when a resonant frequency of the antenna is shifted, and a method for the same.

Another aspect of the present disclosure is to provide a provide a tunable element having a time constant which may be selected such that the reflection by the radiating portion is minimized at the specific frequency, thereby improving the radiation performance of the antenna.

In accordance with an aspect of the present disclosure, an electronic device includes an antenna including a radiating portion and a feeding portion connected to the radiating portion; a tunable element electrically connected to the radiating portion and configured to influence an electrical length of the radiating portion with respect to a specified frequency; an amplifier electrically connected to the feeding portion and configured to amplify a signal to be transmitted to an external electronic device through the radiating portion; and a control circuit electrically connected with the antenna, the tunable element, and the amplifier. The control circuit is configured to determine strength of a signal reflected from the radiating portion while the signal is transmitted to the external electronic device through the radiating portion; and adjust a value of the tunable element to reduce the strength of the reflected signal.

In accordance with an aspect of the present disclosure, an electronic device includes a radiating portion configured to radiate a signal at a specified frequency; a feeding portion electrically connected with the radiating portion; a tunable element electrically connected with one point of the radiating portion and configured to influence an electrical length of the radiating portion; and a control circuit electrically connected with the radiating portion, the feeding portion, and the tunable element. The control circuit is configured to transmit a signal at the specified frequency to the radiating portion through the feeding portion; acquire values associated with reflection of the signal corresponding to a time constant of the tunable element and a plurality of time constants adjacent to the time constant of the tunable element when transmitting the signal; and control the tunable element to have a time constant corresponding to a smallest value among the values associated with the reflection.

In accordance with an aspect of the present disclosure, a method for adjusting an electrical length of a radiating portion of an electronic device including the radiating portion and a tunable element, includes transmitting a signal at a specified frequency to the radiating portion; acquiring values associated with reflection of the signal corresponding to a time constant of the tunable element and a plurality of time constants adjacent to the time constant of the tunable element when transmitting the signal; and controlling the tunable element to have a time constant corresponding to a smallest value among the values associated with the reflection.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
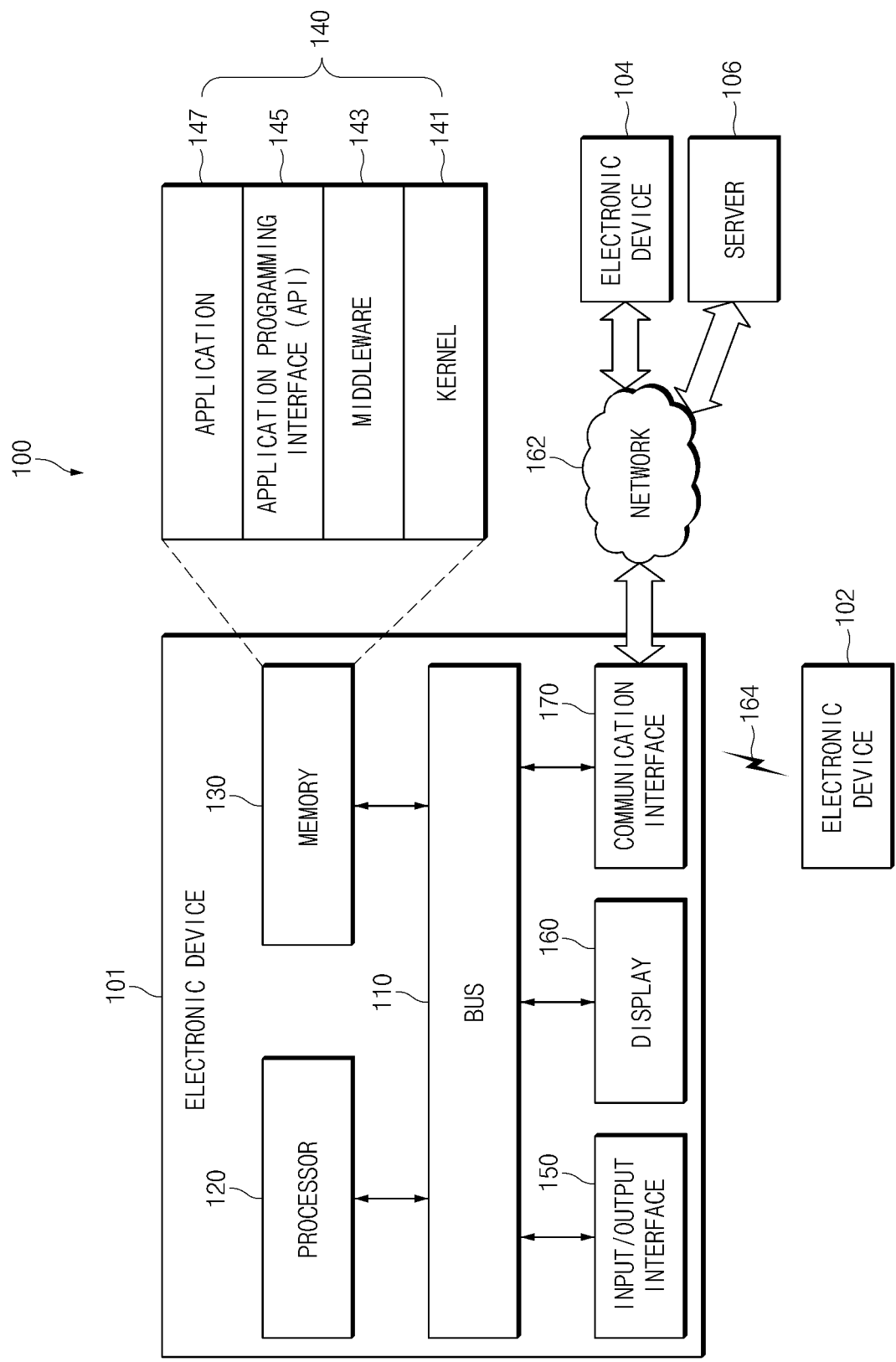
FIG. 1 illustrates an electronic device in a network environment, according to various embodiments of the present disclosure.

Those of ordinary skill in the art will recognize that modifications, equivalents, and/or alternatives on the various embodiments described herein can be made without departing from the scope and spirit of the present disclosure. With regard to the description of drawings, similar elements may be marked by similar reference numerals. The terms of a singular form may include plural forms unless otherwise specified.

In the present disclosure, the expressions "A or B", "at least one of A and/or B", or "one or more of A and/or/and B", etc. may include any and all combinations of one or more of the associated listed items. Terms such as "first", "second", etc. may be used to refer to various elements regardless of the order and/or the priority, and to distinguish the relevant elements from other elements, but do not limit the elements. When an element (e.g., a first element) is referred to as being "(operatively or communicatively) coupled with/to" or "connected to" another element (e.g., a second element), the element may be directly coupled with/to or connected to the other element or an intervening element (e.g., a third element) may be present.

The expression "configured to" used in the present disclosure may be used interchangeably with the expressions "suitable for", "having the capacity to", "adapted to", "made to", "capable of", or "designed to" in hardware or software. The expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor (AP)) which performs corresponding operations by executing one or more software programs which are stored in a memory device.

An electronic device according to various embodiments of the present disclosure may include smartphones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, medical devices, cameras, or wearable devices. According to various embodiments of the present disclosure, the wearable device may include an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit). The electronic device may include televisions (TVs), digital versatile disc (DVD) players, audio players and recorders, refrigerators, air conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™), electronic dictionaries, electronic keys, camcorders, electronic picture frames, etc.

According to an embodiment of the present disclosure, an electronic device may include one of various medical devices (e.g., portable medical measurement devices (e.g., a blood glucose monitoring device, a heartbeat measuring device, a blood pressure measuring device, a body temperature measuring device, etc.), a magnetic resonance angiography (MRA) device, a magnetic resonance imaging (MRI) device, a computed tomography (CT) device, scanners, and ultrasonic devices), navigation devices, global navigation satellite system (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, drones, automatic teller machines (ATMs), points of sales (POSs) devices, or Internet of things (IoT) devices (e.g., light bulbs, various sensors, sprinkler devices, fire alarms, thermostats, street lamps, toasters, exercise equipment, hot water tanks, heaters, boilers, etc.).

The electronic device may include at least one of parts of furniture or buildings/structures, electronic boards, electronic signature receiving devices, projectors, or various measuring instruments (e.g., water meters, electricity meters, gas meters, wave meters, etc.). The electronic device may be a flexible electronic device, or a combination of two or more above-described devices. Furthermore, an electronic device is not limited to the above-described electronic devices. In the present disclosure, the term "user" may refer to a person who uses an electronic device or may refer to a device (e.g., an artificial intelligence electronic device) that uses the electronic device.

FIG. 1 illustrates an electronic device in a network environment, according to various embodiments of the present disclosure.

Referring to FIG. 1, an electronic device 101 in a network environment 100 is illustrated. The electronic device 101 may include a bus 110, a processor 120, a memory 130, an input/output interface 150, a display 160, and a communication interface 170. According to an embodiment of the present disclosure, the electronic device 101 may not include at least one of the above-described elements or may further include other element(s). The bus 110 may interconnect the above-described elements 120 to 170 and may include a circuit for conveying communications (e.g., a control message and/or data) among the above-described elements. The processor 120 may include one or more of a CPU, an AP, or a communication processor (CP). The processor 120 may perform an arithmetic operation or data processing associated with control and/or communication of at least other elements of the electronic device 101.

The memory 130 may include a volatile and/or nonvolatile memory. The memory 130 may store instructions or data associated with other element(s) of the electronic device 101. According to an embodiment of the present disclosure, the memory 130 may store software and/or a program 140. The program 140 may include a kernel 141, a middleware 143, an application programming interface (API) 145, and/or applications 147. At least a part of the kernel 141, the middleware 143, or the API 145 may be referred to as an operating system (OS). The kernel 141 may control or manage system resources (e.g., the bus 110, the processor 120, the memory 130, etc.) that are used to execute operations or functions of other programs (e.g., the middleware 143, the API 145, and the applications 147). Furthermore, the kernel 141 may provide an interface that allows the middleware 143, the API 145, or the applications 147 to access elements of the electronic device 101 so as to control or manage system resources.

The middleware 143 may perform a mediation role such that the API 145 or the applications 147 communicates with the kernel 141 to exchange data. Furthermore, the middleware 143 may process one or more task requests received from the applications 147 according to a priority. The middleware 143 may assign the priority, which makes it possible to use a system resource (e.g., the bus 110, the processor 120, the memory 130, etc.) of the electronic device 101, to at least one of the applications 147, and may process the one or more task requests. The API 145 may be an interface through which the applications 147 controls a function provided by the kernel 141 or the middleware 143, and may include at least one interface or function (e.g., a command) for a file control, a window control, image processing, a character control, etc. The input/output interface 150 may transmit an instruction or data input from a user or another external device, to other element(s) of the electronic device 101 or may output an instruction or data, received from other element(s) of the electronic device 101, to a user or another external device.

The display 160 may include a liquid crystal display (LCD), a light-emitting diode (LED) display, an organic LED (OLED) display, a microelectromechanical systems (MEMS) display, or an electronic paper display. The display 160 may display various contents (e.g., text, an image, a video, an icon, a symbol, etc.) to a user. The display 160 may include a touch screen and may receive a touch, a gesture, proximity, or hovering input using an electronic pen or a part of a user's body. The communication interface 170 may establish communication between the electronic device 101 and an external device (e.g., the first electronic device 102, the second electronic device 104, or the server 106). The communication interface 170 may be connected to the network 162 over wireless communication or wired communication to communicate with the external device.

The wireless communication may include cellular communication using LTE, LTE advanced (LTE-A), code division multiple access (CDMA), wideband CDMA (WCDMA), universal mobile telecommunications system (UMTS), wireless broadband (WiBro), global system for mobile communications (GSM), etc. The wireless communication element 164 may include Wi-Fi, light fidelity (LiFi), Bluetooth™, Bluetooth low energy (BLE), Zigbee, NFC, MST, radio frequency (RF), a body area network, etc. According to an embodiment of the present disclosure, the wireless communication may include GNSS. The GNSS may be a GPS, a global navigation satellite system (Glonass), a Beidou navigation satellite system (Beidou), or the European global satellite-based navigation system (Galileo). Hereinafter, in the present disclosure, the terms "GPS" and "GNSS" may be interchangeably used. The wired communication may include a universal serial bus (USB), a high definition multimedia interface (HDMI), a recommended standard-232 (RS-232), powerline communication, a plain old telephone service (POTS), etc. The network 162 may include telecommunications networks, for example, a computer network (e.g., LAN or WAN), an Internet, or a telephone network.

Each of the first and second external electronic devices 102 and 104 may be a device of which the type is different from or the same as that of the electronic device 101. According to various embodiments of the present disclosure, all or a portion of operations that the electronic device 101 will perform may be executed by another or plurality of electronic devices (e.g., the first electronic device 102, the second electronic device 104, or the server 106). In the case where the electronic device 101 executes any function or service automatically, or in response to a request, the electronic device 101 may not perform the function or the service internally, but, alternatively, may request a portion of a function associated with the electronic device 101 from other electronic devices. The other electronic device may execute the requested function or additional function, and may transmit the execution result to the electronic device 101. The electronic device 101 may provide the requested function or service using the received result, or may additionally process the received result to provide the requested function or service. To this end cloud computing, distributed computing, or client-server computing may be used.

Figure 2:
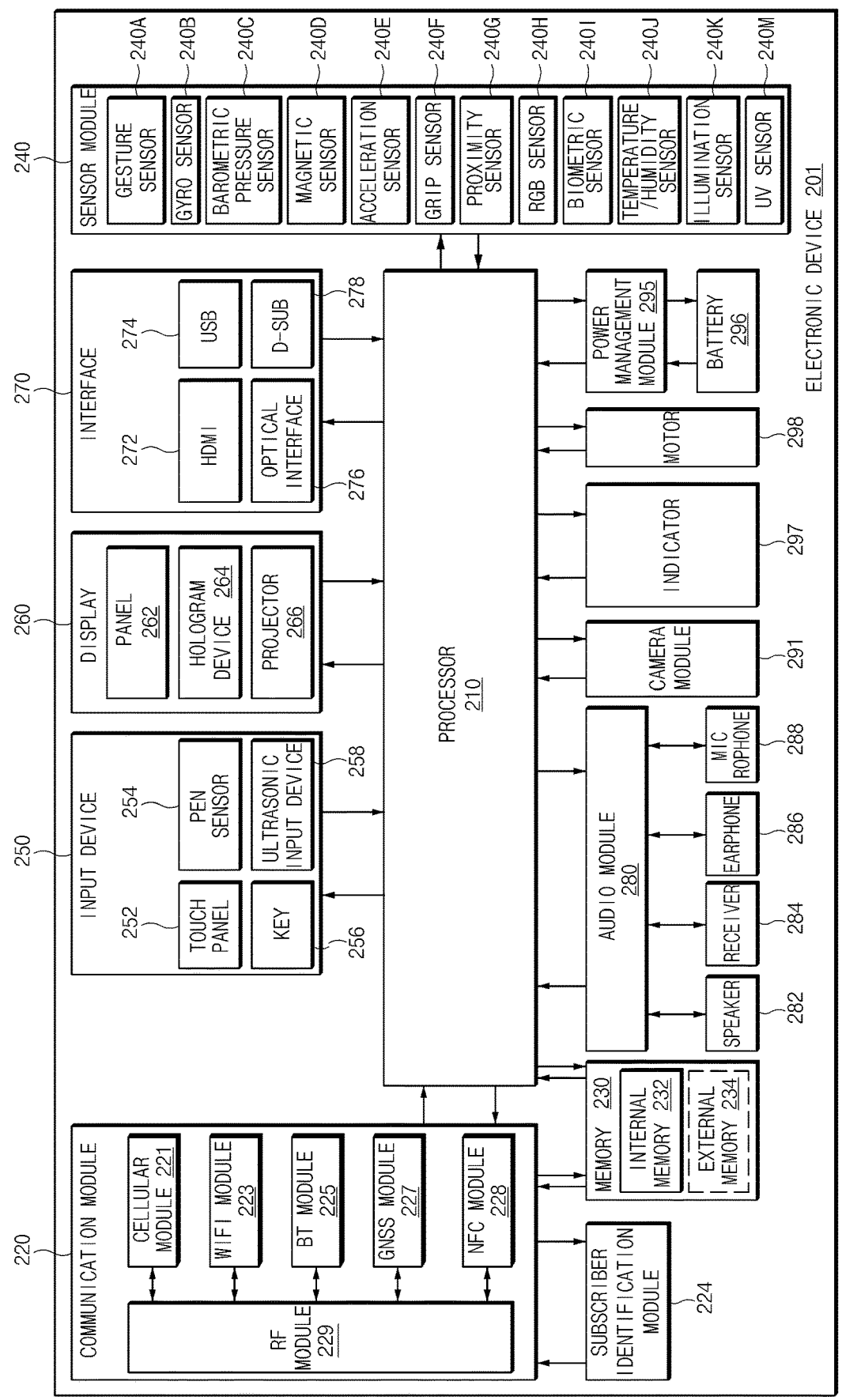
FIG. 2 illustrates a block diagram of an electronic device, according to various embodiments of the present disclosure.

FIG. 2 illustrates a block diagram of an electronic device, according to various embodiments of the present disclosure. An electronic device 201 may include all or a part of the electronic device 101. The electronic device 201 may include one or more processors 210 (e.g., an AP), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298. The processor 210 may be implemented as a system on chip (SoC). The processor 210 may further include a graphic processing unit (GPU) and/or an image signal processor. The processor 210 may include a part (e.g., a cellular module 221) of elements of electronic device 201. The processor 210 may load an instruction or data, which is received from other elements (e.g., a nonvolatile memory), into a volatile memory and process the loaded instruction or data. The processor 210 may store a variety of data in the nonvolatile memory.

The communication module 220 may be configured the same as or similar to the communication interface 170. The communication module 220 may include the cellular module 221, a Wi-Fi module 223, a Bluetooth (BT) module 225, a GNSS module 227, an NFC module 228, and a RF module 229. The cellular module 221 may provide voice communication, video communication, a character service, an Internet service, etc. over a communication network. According to an embodiment of the present disclosure, the cellular module 221 may perform discrimination and authentication of the electronic device 201 within a communication network by using the SIM 224 (e.g., a SIM card). The cellular module 221 may perform a portion of functions that the processor 210 provides. The cellular module 221 may include a CP. A part (e.g., two or more) of the cellular module 221, the Wi-Fi module 223, the BT module 225, the GNSS module 227, or the NFC module 228 may be included within one integrated circuit (IC) or an IC package. The RF module 229 may transmit and receive a communication signal (e.g., an RF signal). The RF module 229 may include a transceiver, a power amplifier module (PAM), a frequency filter, a low noise amplifier (LNA), an antenna, etc. One of the cellular module 221, the Wi-Fi module 223, the BT module 225, the GNSS module 227, or the NFC module 228 may transmit and receive an RF signal through a separate RF module. The SIM 224 may include a card and/or an embedded SIM that includes an SIM and may include unique identify information (e.g., integrated circuit card identifier (ICCID)) or subscriber information (e.g., international mobile subscriber identity (IMSI)).

The memory 230 may include an internal memory 232 or an external memory 234. The internal memory 232 may include a volatile memory (e.g., a dynamic random access memory (DRAM), a static RAM (SRAM), a synchronous DRAM (SDRAM), etc.), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD). The external memory 234 may include a flash drive such as compact flash (CF), secure digital (SD), micro secure digital (Micro-SD), mini secure digital (Mini-SD), extreme digital (xD), a multimedia card (MMC), a memory stick, etc. The external memory 234 may be operatively and/or physically connected to the electronic device 201 through various interfaces.

The sensor module 240 may measure a physical quantity or may detect an operation state of the electronic device 201. The sensor module 240 may convert the measured or detected information to an electric signal. The sensor module 240 may include a gesture sensor 240A, a gyro sensor 240B, a barometric pressure sensor 240C, a magnetic sensor 240D, an acceleration sensor 240E, a grip sensor 240F, the proximity sensor 240G, a color sensor 240H (e.g., red, green, blue (RGB) sensor), a biometric sensor 240I, a temperature/humidity sensor 240J, an illuminance sensor 240K, or an UV sensor 240M. Additionally or generally, the sensor module 240 may further include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling one or more sensors included therein. According to an embodiment of the present disclosure, the electronic device 201 may further include a processor that is a part of the processor 210 or independent of the processor 210, and is configured to control the sensor module 240. The processor may control the sensor module 240 while the processor 210 remains at a sleep state.

The input device 250 may include a touch panel 252, a (digital) pen sensor 254, a key 256, or an ultrasonic input unit 258. The touch panel 252 may use a capacitive, a resistive, an infrared, and an ultrasonic detecting methods. Also, the touch panel 252 may further include a control circuit. The touch panel 252 may include a tactile layer to provide a tactile reaction to a user. The (digital) pen sensor 254 may be a part of a touch panel or may include an additional sheet for recognition. The key 256 may include a physical button, an optical key, or a keypad. The ultrasonic input device 258 may detect (or sense) an ultrasonic signal, which is generated from an input device, through a microphone 288 and may check data corresponding to the detected ultrasonic signal.

The display 260 may include a panel 262, a hologram device 264, a projector 266, and/or a control circuit for controlling the panel 262, the hologram device 264, or the projector 266. The panel 262 may be implemented to be flexible, transparent, or wearable. The panel 262 and the touch panel 252 may be integrated into a single module. According to an embodiment of the present disclosure, the panel 262 may include a pressure sensor (or force sensor) that measures the intensity of touch pressure by a user. The pressure sensor may be integrated with the touch panel 252, or may be implemented as a separate sensor from the touch panel 252. The hologram device 264 may display a stereoscopic image in a space using a light interference phenomenon. The projector 266 may project light onto a screen so as to display an image. The screen may be arranged in the inside or the outside of the electronic device 201.

The interface 270 may include a HDMI 272, a USB 274, an optical interface 276, or a D-subminiature (D-sub) 278. The interface 270 may be included in the communication interface 170. Additionally or generally, the interface 270 may include a mobile high definition link (MHL) interface, a SD card/MMC interface, or an Infrared Data Association (IrDA) standard interface.

The audio module 280 may convert a sound and an electric signal in dual directions. Part of the audio module 280 may be included in the input/output interface 150. The audio module 280 may process sound information that is input or output through a speaker 282, a receiver 284, an earphone 286, or the microphone 288. The camera module 291 may shoot a still image or a video. According to an embodiment of the present disclosure, the camera module 291 may include one or more image sensors (e.g., a front sensor or a rear sensor), a lens, an image signal processor (ISP), or a flash (e.g., an LED or a xenon lamp). The power management module 295 may manage power of the electronic device 201. A power management integrated circuit (PMIC), a charger IC, or a battery gauge may be included in the power management module 295. The PMIC may utilize a wired charging method and/or a wireless charging method. The wireless charging method may include a magnetic resonance method, a magnetic induction method, or an electromagnetic method and may further include an additional circuit, for example, a coil loop, a resonant circuit, a rectifier, etc. The battery gauge may measure a remaining capacity of the battery 296 and a voltage, current or temperature thereof while the battery is charged. The battery 296 may include a rechargeable battery and/or a solar battery.

The indicator 297 may display a specific state of the electronic device 201 or a part thereof (e.g., the processor 210), such as a booting state, a message state, a charging state, etc. The motor 298 may convert an electrical signal into a mechanical vibration and may generate a vibration effect, a haptic effect, etc. The electronic device 201 may include a processing device (e.g., a GPU) for supporting a mobile TV. The processing device for supporting the mobile TV may process media data according to the standards of DMB, digital video broadcasting (DVB), MediaFLO™, etc. Each of the above-mentioned elements of the electronic device according to various embodiments of the present disclosure may be configured with one or more components, and the names of the elements may be changed according to the type of the electronic device. Some elements of the electronic device 201 may be omitted or other additional elements may be added. Furthermore, some of the elements of the electronic device may be combined with each other so as to form one component, so that the functions of the elements may be performed in the same manner as before the combination.

Figure 3:
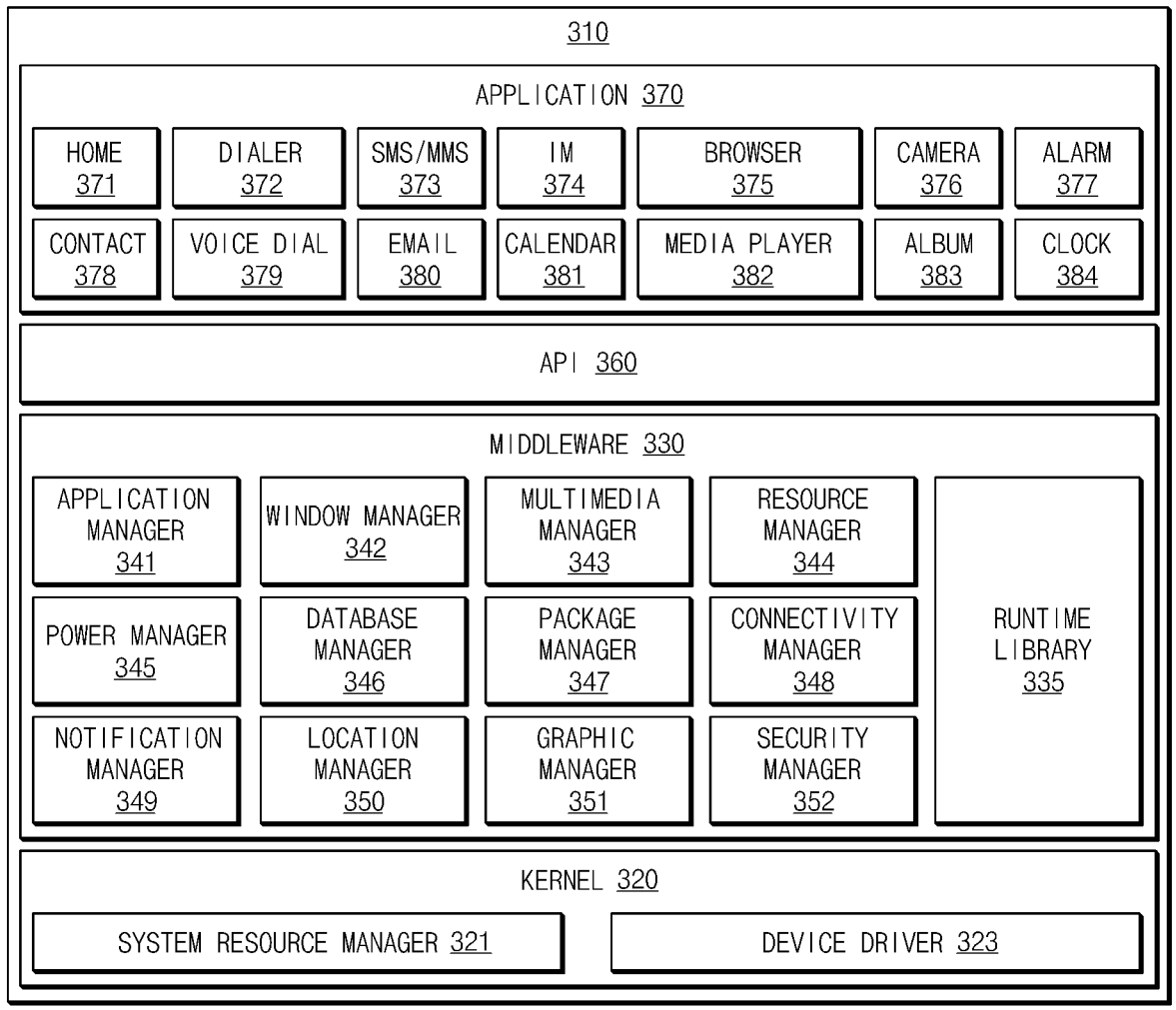
FIG. 3 illustrates a block diagram of a program module, according to various embodiments of the present disclosure.

FIG. 3 illustrates a block diagram of a program module, according to various embodiments of the present disclosure.

According to an embodiment of the present disclosure, a program module 310 may include an OS to control resources associated with an electronic device 101, and/or applications 147 driven on the OS. The OS may be Android™, iOS™, Windows™, Symbian™, Tizen™, or Bala™. The program module 310 may include a kernel 320, a middleware 330, an API 360, and/or an application 370. At least a portion of the program module 310 may be preloaded on an electronic device or may be downloadable from an external electronic device (e.g., the first electronic device 102, the second electronic device 104, the server 106, etc.).

The kernel 320 may include a system resource manager 321 or a device driver 323. The system resource manager 321 may control, allocate, or retrieve system resources. According to an embodiment of the present disclosure, the system resource manager 321 may include a process managing unit, a memory managing unit, a file system managing unit, etc. The device driver 323 may include a display driver, a camera driver, a Bluetooth driver, a shared memory driver, a USB driver, a keypad driver, a Wi-Fi driver, an audio driver, or an inter-process communication (IPC) driver. The middleware 330 may provide a function that the application 370 needs in common, or may provide functions to the application 370 through the API 360 to allow the application 370 to efficiently use limited system resources of the electronic device. The middleware 330 may include a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include a library module that is used by a compiler to add a new function through a programming language while the application 370 is being executed. The runtime library 335 may perform input/output management, memory management, or capacities about arithmetic functions. The application manager 341 may manage a life cycle of at least one application of the application 370. The window manager 342 may manage a graphic user interface (GUI) resource that is used on a screen. The multimedia manager 343 may identify a format necessary for playing diverse media files, and may perform encoding or decoding of media files by using a codec suitable for the format. The resource manager 344 may manage resources such as a memory space or source code of the application 370. The power manager 345 may manage a battery or power, and may provide power information for an operation of an electronic device. According to an embodiment of the present disclosure, the power manager 345 may operate with a basic input/output system (BIOS). The database manager 346 may generate, search for, or modify database that is to be used in the application 370. The package manager 347 may install or update an application that is distributed in the form of a package file.

The connectivity manager 348 may manage a wireless connection. The notification manager 349 may provide an event arrival message, appointment, or proximity notification to a user. The location manager 350 may manage location information about an electronic device. The graphic manager 351 may manage a graphic effect that is provided to a user, or manage a user interface relevant thereto. The security manager 352 may provide system security or user authentication. According to an embodiment of the present disclosure, the middleware 330 may include a telephony manager for managing a voice or video call function of the electronic device or a middleware module that combines various functions of the above-described elements. The middleware 330 may provide a module specialized to each OS kind to provide differentiated functions. Additionally, the middleware 330 may dynamically remove a part of the preexisting elements or may add new elements thereto. The API 360 may be a set of programming functions and may be provided with a configuration that is variable depending on the type of the OS. For example, in the case where an OS is Android or iOS, one API set per platform may be provided. In the case where an OS is Tizen, two or more API sets per platform may be provided.

The application 370 may include applications such as a home application 371, a dialer application 372, an SMS/MMS application 373, an instant message (IM) application 374, a browser application 375, a camera application 376, an alarm application 377, a contact application 378, a voice dial application 379, an e-mail application 380, a calendar application 381, a media player application 382, an album application 383, a clock application 384, a healthcare application (e.g., measuring an exercise quantity, blood sugar level, etc.) or an application offering environment information (e.g., information of barometric pressure, humidity, temperature, etc.).

According to an embodiment of the present disclosure, the application 370 may include an information exchanging application to support information exchange between an electronic device and an external electronic device. The information exchanging application may include a notification relay application for transmitting specific information to an external electronic device, or a device management application for managing the external electronic device. The notification relay application may include a function of transmitting notification information, which arise from other applications, to an external electronic device or may receive notification information from an external electronic device and provide the notification information to a user. The device management application may install, delete, or update a function (e.g., turn-on/turn-off of an external electronic device itself (or a part of components) or adjustment of brightness (or resolution) of a display) of the external electronic device which communicates with the electronic device, and an application running in the external electronic device. The application 370 may include an application (e.g., a healthcare application of a mobile medical device) that is assigned in accordance with an attribute of an external electronic device. The application 370 may include an application that is received from an external electronic device. A portion of the program module 310 may be implemented by software, firmware, hardware, or a combination (e.g., execution) of two or more thereof, and may include modules, programs, routines, sets of instructions, processes, etc. for performing one or more functions.

Figure 4:
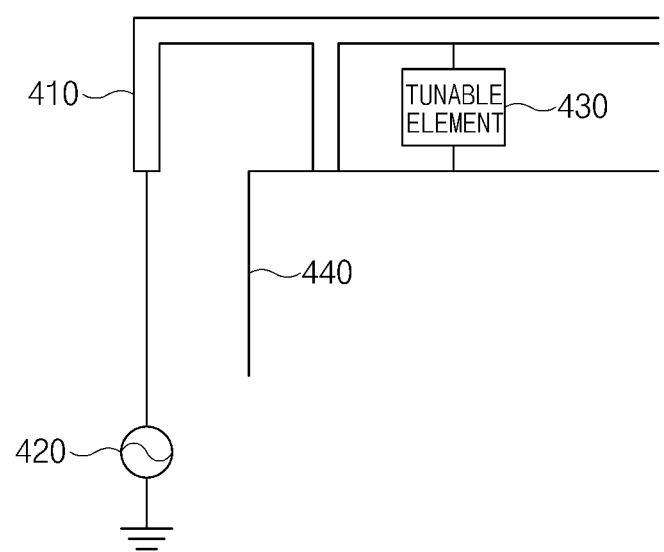
FIG. 4 illustrates elements of an antenna included in an electronic device, according to an embodiment of the present disclosure.

FIG. 4 illustrates elements of an antenna included in an electronic device, according to an embodiment of the present disclosure.

Referring to FIG. 4, an electronic device 400 may include a radiating portion 410, a feeding portion 420, a tunable element 430, and a grounding portion 440. The electronic device 400 may be one of various devices which support wireless communication.

According to an embodiment of the present disclosure, the radiating portion 410 may be configured to radiate a signal of a specified frequency. The radiating portion 410 may include a conductor. The radiating portion 410 may be formed in an F shape as illustrated in FIG. 4. The radiating portion 410 may radiate a signal, which is received from the feeding portion 420, to the outside. The radiating portion 410 may receive a signal from the outside.

According to an embodiment of the present disclosure, the feeding portion 420 may be electrically connected with the radiating portion 410. The feeding portion 420 may be electrically connected with one end of the radiating portion 410. The feeding portion 420 may transmit a signal to the radiating portion 410. The feeding portion 420 may serve as an electrical path for transmitting a signal generated from a communication module 220 or a processor 210 to the radiating portion 410.

In the present disclosure, the radiating portion 410 and the feeding portion 420 may be referred to as "antenna". According to an embodiment of the present disclosure, the antenna included in the electronic device 400 may be a planar inverted F antenna (PIFA).

According to an embodiment of the present disclosure, the tunable element 430 may be electrically connected with one point of the radiating portion 410. The tunable element 430 may be connected with the radiating portion 410 in parallel (e.g., shunt). The tunable element 430 may be a device having one end connected with the radiating portion 410 and an opposite end connected with the grounding portion 440. The tunable element 430 may include one or more capacitors and/or one or more inductors, and the time constant of the tunable element 430 may be tunable. The tunable element 430 may include a switch, a complementary metal-oxide semiconductor (CMOS), a MEMS, or a dielectric tunable element. The tunable element 430 may be controlled to have one of a plurality of specified time constants. The electronic device 400 may perform aperture tuning (or frequency tuning) by changing the time constant of the tunable element 430. Through aperture tuning, the electrical length and the resonant frequency of the radiating portion 410 may be changed.

According to an embodiment of the present disclosure, the grounding portion 440 may be electrically connected with one point of the radiating portion 410 and the opposite end of the tunable element 430. As the radiating portion 410 and the tunable element 430 are connected with the grounding portion 440, the radiating portion 410 and the tunable element 430 may be grounded.

Figure 5:
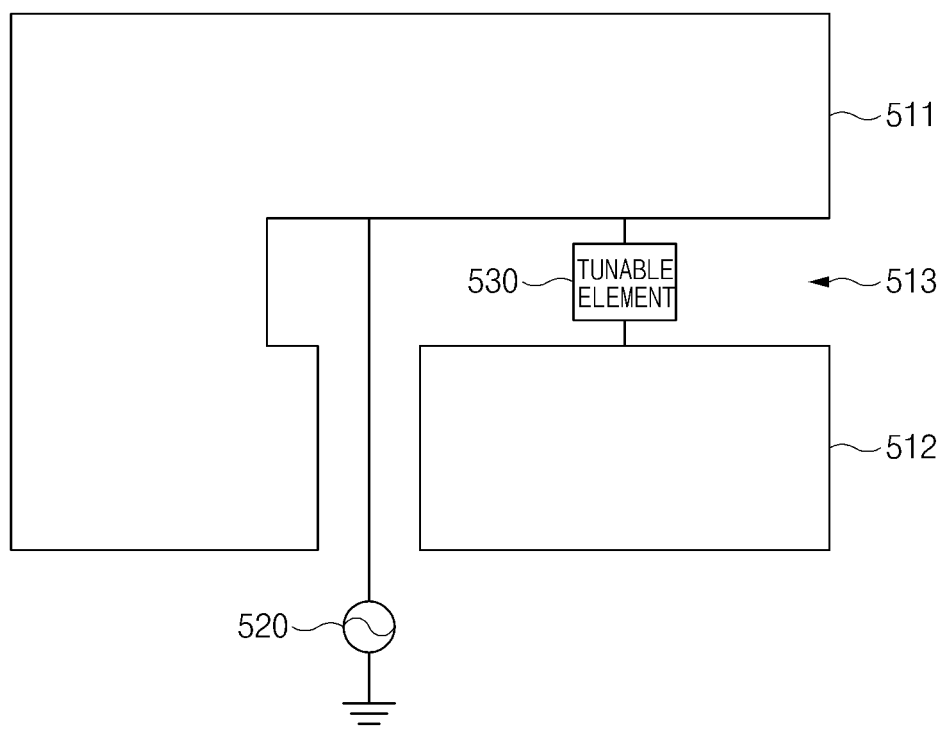
FIG. 5 illustrates elements of an antenna included in an electronic device, according to an embodiment of the present disclosure.

FIG. 5 illustrates elements of an antenna included in an electronic device, according to an embodiment of the present disclosure.

Referring to FIG. 5, an electronic device 500 may include first radiating portion 511, second radiating portion 512, a slit 513, a feeding portion 520, and a tunable element 530. The electronic device 500 may be one of various devices which support wireless communication.

According to an embodiment of the present disclosure, the first radiating portion 511 and the second radiating portion 512 may be configured to radiate a signal at a specified frequency. The first radiating portion 511 and second radiating portion 512 may include conductors. As illustrated in FIG. 5, a slit 513 may be formed between the first radiating portion 511 and the second radiating portion 512. A signal transmitted from the feeding portion 520 to the first radiating portion 511 and the second radiating portion 512 may be radiated to the outside through the slit 513. A signal received from the outside may be received through the slit 513.

According to an embodiment of the present disclosure, the feeding portion 520 may be electrically connected with the first radiating portion 511 and second radiating portion 512. The feeding portion 520 may be electrically connected with one point of the first radiating portion 511 and the second radiating portion 512, which is adjacent to the slit 513. The feeding portion 520 may transmit a signal to the first radiating portion 511 and the second radiating portion 512. The feeding portion 520 may serve as an electrical path for transmitting a signal generated from a communication module 220 or a processor 210 to the first radiating portion 511 and the second radiating portion 512.

In the present disclosure, the first radiating portion 511 and the second radiating portion 512, and the feeding portion 520 may be referred to as "antenna". According to an embodiment of the present disclosure, the antenna included in the electronic device 500 may be a slit antenna.

According to an embodiment of the present disclosure, the tunable element 530 may be electrically connected with the first radiating portion 511 and the second radiating portion 512. The tunable element 530 may be connected with the first radiating portion 511 and the second radiating portion 512 in parallel (e.g., shunt). The tunable element 530 may have one end electrically connected with a first radiating portion 511 and an opposite end electrically connected with a second radiating portion 512. The tunable element 530 may include one or more capacitors and/or one or more inductors, and the time constant of the tunable element 530 may be tunable. The tunable element 530 may include a switch, CMOS, MEMS, or dielectric tunable element. The tunable element 530 may be controlled to have one of a plurality of specified time constants. If the time constant of the tunable element 530 is changed, the electrical lengths and the resonance frequencies of the first radiating portion 511 and the second radiating portion 512 may be changed.

Figure 6:
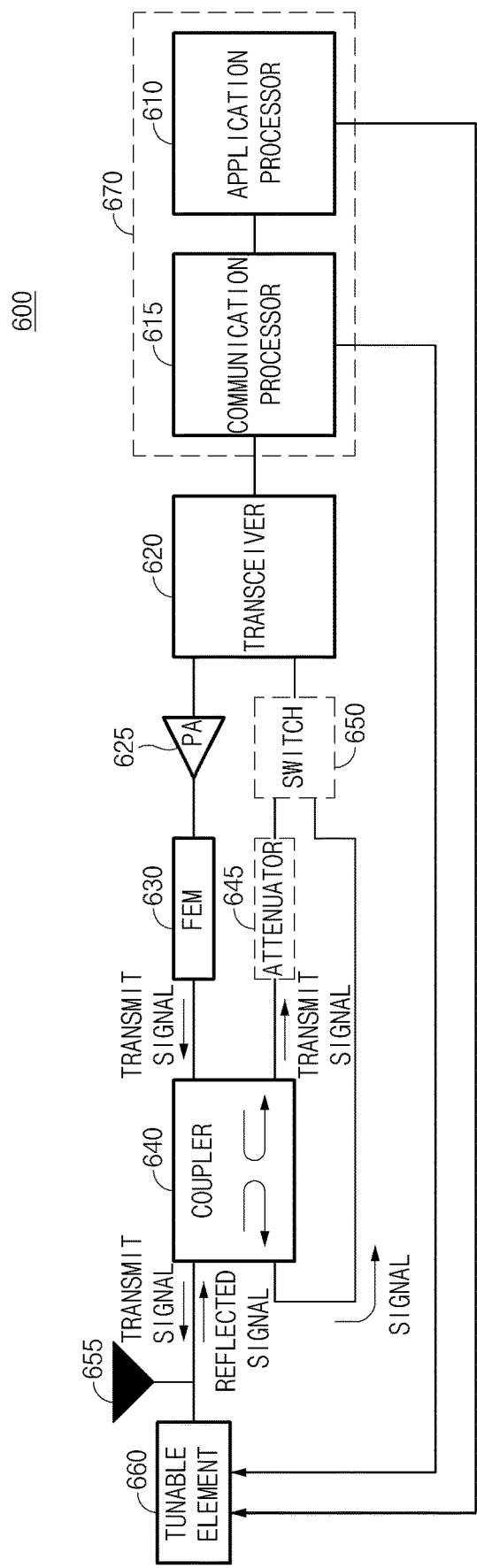
FIG. 6 is a block diagram illustrating elements of an electronic device, according to an embodiment of the present disclosure.

FIG. 6 is a block diagram illustrating elements of an electronic device, according to an embodiment of the present disclosure.

Referring to FIG. 6, an electronic device 600 may include an application processor 610, a communication processor 615, a transceiver 620, a power amplifier (PA) 625, a front end module (FEM) 630, a coupler 640, an attenuator 645, a switch 650, a radiating portion 655, and a tunable element 660. The electronic device 600 may be one of various devices which support wireless communication.

According to an embodiment of the present disclosure, the application processor 610 may be electrically connected with the communication processor 615 and the tunable element 660. The application processor 610 may control the communication processor 615. The application processor 610 may include the communication processor 615. The application processor 610 may control the time constant of the tunable element 660. The application processor 610 may control the tunable element 660 through a general-purpose input/output (GPIO) interface, a mobile industry processor interface (MIPI), or an inter-integrated circuit (I2C) interface. The transceiver 620 may receive, from the coupler 640, a part of a signal for recognizing the strength of the signal and a part of a reflected signal for recognizing the strength of the reflected signal. The application processor 610 or the communication processor 615 may receive information on the strength of the signal and the strength of the reflected signal from the transceiver 620. The application processor 610 may be an element corresponding to a part of the processor 210.

According to an embodiment of the present disclosure, the communication processor 615 may be electrically connected with the transceiver 620. The communication processor 615 may generate a signal to be radiated through a radiating portion 655 and may transmit the signal to the transceiver 620. The communication processor 615 may receive, through the transceiver 620, a part of the signal for recognizing the strength of the signal and a part of a reflected signal for recognizing the strength of the reflected signal. The communication processor 615 may receive a signal from the transceiver 620. The communication processor 615 may control the transceiver 620, the power amplifier 625, the front end module 630, the attenuator 645, and the switch 650. The communication processor 615 may control the time constant of the tunable element 660. The communication processor 615 may be an element corresponding to a part of the processor 210 or a part of the communication module 220.

According to an embodiment of the present disclosure, the transceiver 620 may receive or transmit a signal. The transceiver 620 may receive the signal from the communication processor 615 and may transmit the signal to the power amplifier 625. The transceiver 620 may receive a signal from the radiating portion 655. The transceiver 620 may receive a part of the signal through the attenuator 645 and the switch 650. The transceiver 620 may receive a part of the reflected signal through the switch 650. The transceiver 620 may transmit part of the signal and part of the reflected signal to the communication processor 615. The transceiver 620 may be an element corresponding to a part of the communication module 220. The transceiver 620 may be included in the communication processor 615.

According to an embodiment of the present disclosure, the power amplifier 625 may be electrically connected with the front end module 630. The power amplifier 625 may be connected with the radiating portion 655 through the front end module 630 and the coupler 640. The power amplifier 625 may amplify a signal to be transmitted to an external device through the radiating portion 655. The signal amplified by the power amplifier 625 may be transmitted to the front end module 630.

According to an embodiment of the present disclosure, the front end module 630 may receive a signal amplified by the power amplifier 625. The front end module 630 may transmit the amplified signal to the coupler 640.

According to an embodiment of the present disclosure, the coupler 640 may receive a signal from the front end module 630. The coupler 640 may transmit a part of the signal, which is to be radiated to the outside, to the radiating portion 655 and may transmit a remaining part of the signal for recognizing the strength of the signal to the attenuator 645. For example, the coupler 640 may transmit 99% of the signal, which is received thereto from the front end module 630, to the radiating portion 655, and may transmit 1% of the signal to the attenuator 645. The coupler 640 may receive a reflected signal which is a part of the signal reflected from the radiating portion 655 when transmitting the signal to the radiating portion 655. The coupler 640 may transmit the part of the reflected signal for recognizing the strength of the reflected signal to the switch 650.

According to an embodiment of the present disclosure, the attenuator 645 may receive a part of a signal from the coupler 640. The attenuator 645 may attenuate the received part of the signal. The attenuator 645 may transmit the attenuated signal to the switch 650.

According to an embodiment of the present disclosure, the switch 650 may be electrically connected with the attenuator 645, the coupler 640, and the transceiver 620. The switch 650 may operate such that the attenuator 645 is electrically connected with the transceiver 620, or may operate such that the coupler 640 is electrically connected with the transceiver 620. The switch 650 may transmit a part of a signal received from the attenuator 645 or a part of a reflected signal received from the coupler 640. The switch 650 may be a single pole double throw (SPDT) switch. The switch 650 may be controlled by the communication processor 615 or the application processor 610.

According to various embodiments of the present disclosure, the attenuator 645 and the switch 650 may be omitted. The attenuator 645 and the switch 650 may be selectively employed depending on the performance of the coupler 640 and/or the transceiver 620.

According to an embodiment of the present disclosure, the radiating portion 655 and the tunable element 660 may have similar configurations to the configurations of the radiating portion 410 and the tunable element 430 or the first radiating portion 511 and the second radiating portion 512, and the tunable element 530.

According to an embodiment of the present disclosure, a control circuit 670 is referred to as the application processor 610 and/or the communication processor 615. The following description will be made by teaching the operations performed by the application processor 610 and/or the communication processor 615 as operations performed by the control circuit 670.

According to an embodiment of the present disclosure, the control circuit 670 may transmit a signal at a specified frequency to the radiating portion 655 through a feeding portion 420. The control circuit 670 may generate the signal at the specified frequency. When the control circuit 670 attempts to radiate a signal to the outside through the radiating portion 655, the control circuit 670 may generate the signal at the specified frequency corresponding to the resonant frequency of the radiating portion 655. The signal generated by the control circuit 670 may be amplified by the power amplifier 625 and a part of the amplified signal may be transmitted to the radiating portion 655 through the coupler 640. A remaining part of the amplified signal may be transmitted to the attenuator 645 through the coupler 640. The part of the signal transmitted to the radiating portion 655 may be radiated to the outside and the remaining part of the signal transmitted to the radiating portion 655 may be reflected. A part of the reflected signal may be transmitted to the switch 650 through the coupler 640.

According to an embodiment of the present disclosure, the control circuit 670 may detect the strength of a signal reflected from the radiating portion 655 while a signal is being transmitted to the outside of the electronic device 600 through the radiating portion 655. The control circuit 670 may receive a part of the reflected signal from the coupler 640 through the switch 650 and the transceiver 620. The control circuit 670 may detect the strength of the reflected signal based on the received part of the reflected signal.

According to an embodiment of the present disclosure, the control circuit 670 may adjust the value of the tunable element 660 to a first specified value and may acquire the strength of another signal reflected from the radiating portion 655 corresponding to the tunable element 660 adjusted to the first specified value. The control circuit 670 may detect the strength of the reflected signal before adjusting the value of the tunable element 660. Thereafter, the control circuit 670 may adjust the time constant of the tunable element 660 to the first specified value and may detect the strength of the reflected signal from the radiating portion 655.

According to an embodiment of the present disclosure, in the case that the strength of another signal belongs to a specified range, the control circuit 670 may adjust the value of the tunable element 660 to a second specified value corresponding to a change direction of the first specified value. In the case that the strength of another signal belongs to another range, the control circuit 670 may adjust the value of the tunable element 660 to a third specified value corresponding to a direction different from the change direction of the first specified value. The control circuit 670 may adjust the value of the tunable element 660 to the second specified value corresponding to the change direction of the first specified value if the strength of the reflected signal is reduced. If the first specified value is greater than the value present before adjustment, the control circuit 670 may adjust the value of the tunable element 660 to the second specified value which is greater than the first specified value. If the first specified value is less than the value present before adjustment, the value of the tunable element 660 may be adjusted to the second specified value which is less than the first specified value. The control circuit 670 may adjust the value of the tunable element 660 to the second specified value corresponding to the direction different from the change direction of the first specified value if the strength of the reflected signal is increased. If the first specified value is greater than the value present before adjustment, the control circuit 670 may adjust the value of the tunable element 660 to the second specified value which is less than the first specified value. If the first specified value is less than the value present before adjustment, the value of the tunable element 660 may be adjusted to the second specified value greater than the first specified value.

According to an embodiment of the present disclosure, the control circuit 670 may adjust the value of the tunable element 660 based on the strength of the reflected signal such that the strength of the reflected signal is reduced. The value of the tunable element 660 may be adjusted to a value allowing the reflected signal to have the least strength among strengths of the reflected signal.

According to an embodiment of the present disclosure, the control circuit 670 may acquire values associated with the reflection of a signal from the radiating portion 655 and corresponding to a time constant of the tunable element 660 and a plurality of time constants of the tunable element 660, which are adjacent to the time constant of the tunable element 660, when transmitting the signal. The value associated with the reflection may be a reflective coefficient or a VSWR associated with the signal and the reflected signal. The control circuit 670 may control the tunable element 660 to have one time constant among a plurality of specified time constants. The control circuit 670 may acquire a first value associated with the reflection corresponding to a first time constant of the tunable element 660 when transmitting the signal. The control circuit 670 may acquire the first value associated with the reflection, based on the strength of a part of a signal transmitted from the coupler 640 and the strength of a part of the reflected signal from the coupler 640. The control circuit 670 may control the tunable element 660 to have a second time constant, which is greater than the first time constant and adjacent to the first time constant, among the plurality of time constants, after acquiring the first value corresponding to the first time constant. The control circuit 670 may acquire a second value associated with the reflection based on the strength of a part of a signal transmitted from the coupler 640 and the strength of a part of a reflected signal from the coupler 640, after controlling the tunable element 660. The control circuit 670 may control the tunable element 660 to have a third time constant, which is less than the first time constant and adjacent to the first time constant, among the plurality of time constants, after acquiring the second value corresponding to the second time constant. The control circuit 670 may acquire a third value associated with the reflection based on the strength of a part of a signal transmitted from the coupler 640 and the strength of a part of a reflected signal from the coupler 640, after controlling the tunable element 660.

According to an embodiment of the present disclosure, the control circuit 670 may control the tunable element 660 to have a time constant corresponding to the smallest value among the values associated with the reflection. The control circuit 670 may control the tunable element 660 to have a time constant (e.g., a first time constant, a second time constant, or a third time constant) corresponding to the smallest value among the first, second, and third values associated with the reflection.

According to an embodiment of the present disclosure, the control circuit 670 may adaptively repeat an operation of transmitting a signal, an operation of acquiring a value associated with the reflection, and an operation of controlling the tunable element 660, after controlling the tunable element 660 to have a time constant corresponding to the smallest value. If the second value is the smallest value, after controlling the tunable element 600 to have the second time constant, the control circuit 670 may acquire a fourth value associated with the reflection based on the strength of a part of a signal transmitted from the coupler 640 and the strength of a part of a reflected signal from the coupler 640. After acquiring the fourth value corresponding to the second time constant, the control circuit 670 may control the tunable element 660 to have a fourth time constant, which is greater than the second time constant and adjacent to the second time constant, among the plurality of time constants. After the tunable element 660 is controlled, the control circuit 670 may acquire a fifth value associated with the reflection based on the strength of a part of a signal transmitted from the coupler 640 and the strength of a part of the reflected signal from the coupler 640. After acquiring the fifth value corresponding to the fourth time constant, the control circuit 670 may control the tunable element 660 to have the fifth time constant, which is less than the second time constant and adjacent to the second time constant, among the plurality of time constants. After the tunable element 660 is controlled, the control circuit 670 may acquire a sixth value associated with the reflection based on the strength of a part of a signal transmitted from the coupler 640 and the strength of a part of a reflected signal from the coupler 640. The control circuit 670 may control the tunable element 660 to have a time constant (e.g., the second time constant, the fourth time constant, or the fifth time constant) corresponding to the smallest value among the fourth, fifth, and sixth values associated with the reflection. If the sixth value is the smallest value, after controlling the tunable element 660 to have the fifth time constant, the control circuit 670 may repeat the above operations based on the fifth time constant. As described above, the tunable element 660 is repeatedly tuned, thereby improving the radiation performance of the radiating portion 655.

According to an embodiment of the present disclosure, the control circuit 670 may acquire values associated with the reflection, if at least one of the strength of a signal, the strength of a reflected signal, the reflection coefficient associated with the signal and the reflected signal, and a VSWR associated with the signal and the reflected signal is changed in excess of the specified ranges. The control circuit 670 may not perform the above operations for tuning the tunable element 660 if the strength of the signal, the strength of the reflected signal, the reflection coefficient, or the VSWR is not changed in excess of the specified range. If the strength of the signal, the strength of the reflected signal, the reflection coefficient, or the VSWR is changed in excess of the specified range, the control circuit 670 may determine the tuning of the tunable element 660 to be necessary and may start the above operations.

Figure 7:
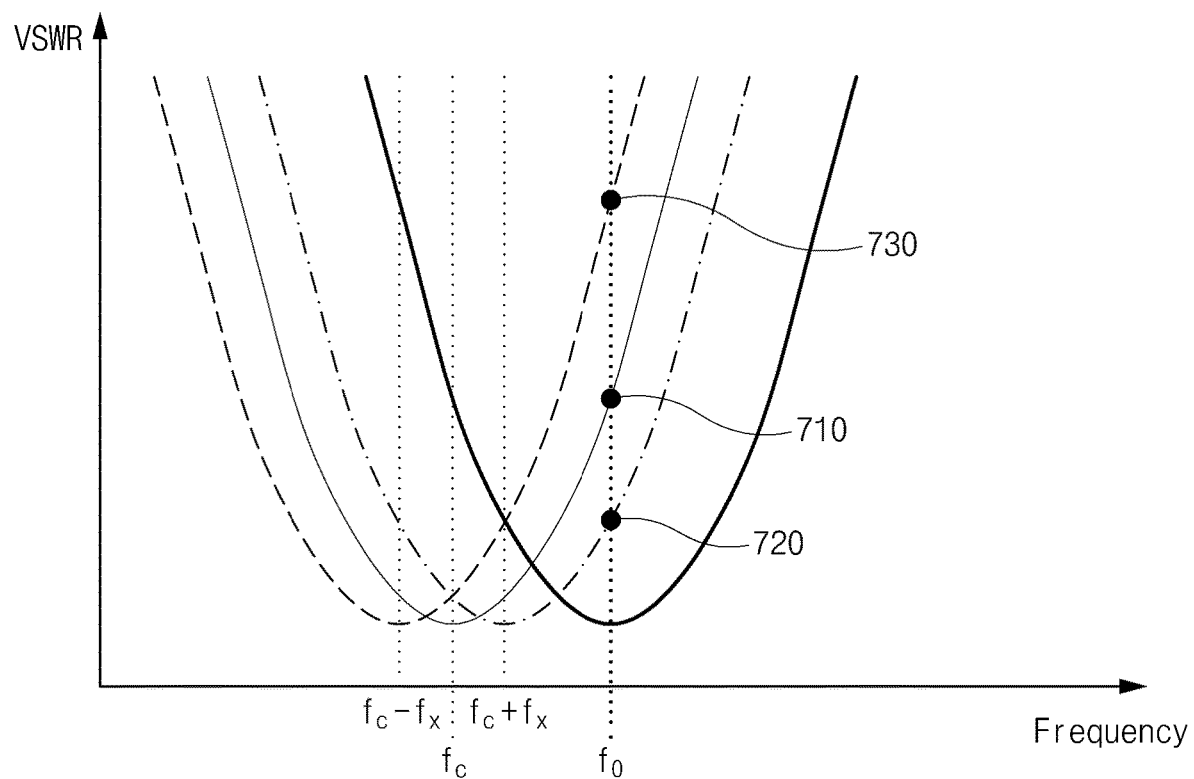
FIG. 7 is a graph illustrating a voltage standing wave ratio (VSWR) as a function of frequency of an antenna in an electronic device, according to an embodiment of the present disclosure.

FIG. 7 is a graph illustrating a VSWR as a function of a frequency of an antenna in an electronic device, according to an embodiment of the present disclosure.

Referring to FIG. 7, an electronic device (e.g., the electronic device 600) may radiate a signal at a specified frequency ($f_o$). In this case, the resonant frequency of a radiating portion 655 included in the electronic device may be shifted to a first frequency ($f_c$) due to external factors, such as an external object (e.g., the hand of a user) making contact with the electronic device, the state of a medium that the signal is radiated, or the time constant of a tunable element 660. The electronic device may calculate a first VSWR 710 based on the strength of a signal and the strength of a reflected signal, when transmitting the signal at the specified frequency ($f_o$).

According to an embodiment of the present disclosure, the electronic device (e.g., the control circuit 670) may adjust the time constant of the tunable element such that the resonant frequency of the electronic device is shifted to a second frequency ($f_c+f_x$) higher than the first frequency ($f_c$) after calculating the first VSWR 710. The electronic device may adjust the resonant frequency by changing the time constant. The electronic device may calculate a second VSWR 720 based on the strength of the signal and the strength of the reflected signal, when transmitting the signal at a specified frequency ($f_o$) after adjusting the time constant of the tunable element.

According to an embodiment of the present disclosure, the electronic device may adjust the time constant of the tunable element such that the resonant frequency of the electronic device is shifted to a third frequency ($f_c-f_x$) lower than the first frequency ($f_c$) after calculating the second VSWR 720. The electronic device may calculate a third VSWR 730 based on the strength of the signal and the strength of the reflected signal, when transmitting the signal at the specified frequency ($f_o$) after adjusting the time constant of the tunable element.

According to an embodiment of the present disclosure, the electronic device may compare the first VSWR 710, the second VSWR 720, and the third VSWR 730. The electronic device 500 may control the tunable element to have a time constant corresponding to the second VSWR 720 which is the lowest one among the first VSWR 710, the second VSWR 720, and the third VSWR 730. The VSWR may be lowered and the radiation performance of the radiating portion may be improved, by controlling the tunable element.

Figure 8:
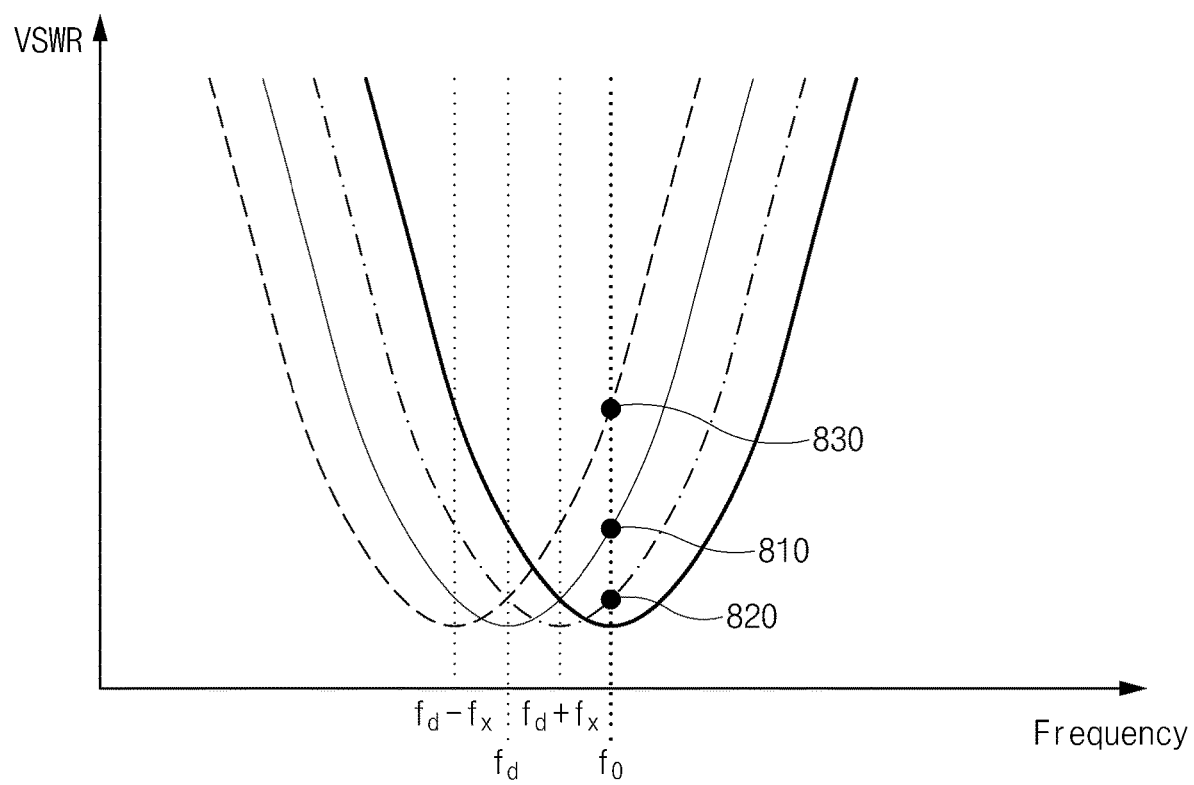
FIG. 8 is a graph illustrating a VSWR as a function of frequency of an antenna in an electronic device, according to an embodiment of the present disclosure.

FIG. 8 is a graph illustrating a VSWR as a function at a frequency of an antenna in an electronic device, according to an embodiment of the present disclosure.

Referring to FIG. 8, as described above, if a tunable element is controlled to have the time constant corresponding to the second VSWR 720, the resonant frequency of a radiating portion included in the electronic device may be shifted to a fourth frequency ($f_d$) due to the change in the time constant of the tunable element. The electronic device may calculate a fourth VSWR 810 based on the strength of the signal and the strength of the reflected signal, when transmitting a signal at a specified frequency ($f_o$).

According to an embodiment of the present disclosure, the electronic device may adjust the time constant of the tunable element such that the resonant frequency of the electronic device is shifted to a fifth frequency ($f_d+f_x$) which is higher than the fourth frequency ($f_d$) after calculating the fourth VSWR 810. The electronic device may calculate a fifth VSWR 820 based on the strength of the signal and the strength of the reflected signal when transmitting the signal at the specified frequency ($f_o$) after adjusting the time constant of the tunable element.

According to an embodiment of the present disclosure, the electronic device may adjust the time constant of the tunable element such that the resonant frequency of the electronic device is shifted to a sixth frequency ($f_d-f_x$) which is lower than the fourth frequency ($f_d$) after calculating the fifth VSWR 820. The sixth frequency ($f_d-f_x$) may be equal to the first frequency ($f_c$). The electronic device may calculate a sixth VSWR 830 based on the strength of the signal and the strength of the reflected signal when transmitting the signal at the specified frequency ($f_o$) after adjusting the time constant of the tunable element.

According to an embodiment of the present disclosure, the electronic device may compare the fourth VSWR 810, the fifth VSWR 820, and the sixth VSWR 830. The electronic device 500 may control the tunable element to have a time constant corresponding to the fifth VSWR 820 which is the smallest one among the fourth VSWR 810, the fifth VSWR 820, and the sixth VSWR 830. The VSWR may be lowered and the radiation performance of the radiating portion may be improved, by controlling the tunable element.

As described with reference to FIGS. 7 and 8, the electronic device may control the tunable element step by step or adaptively to improve the radiation efficiency at the specified frequency ($f_o$).

Figure 9:
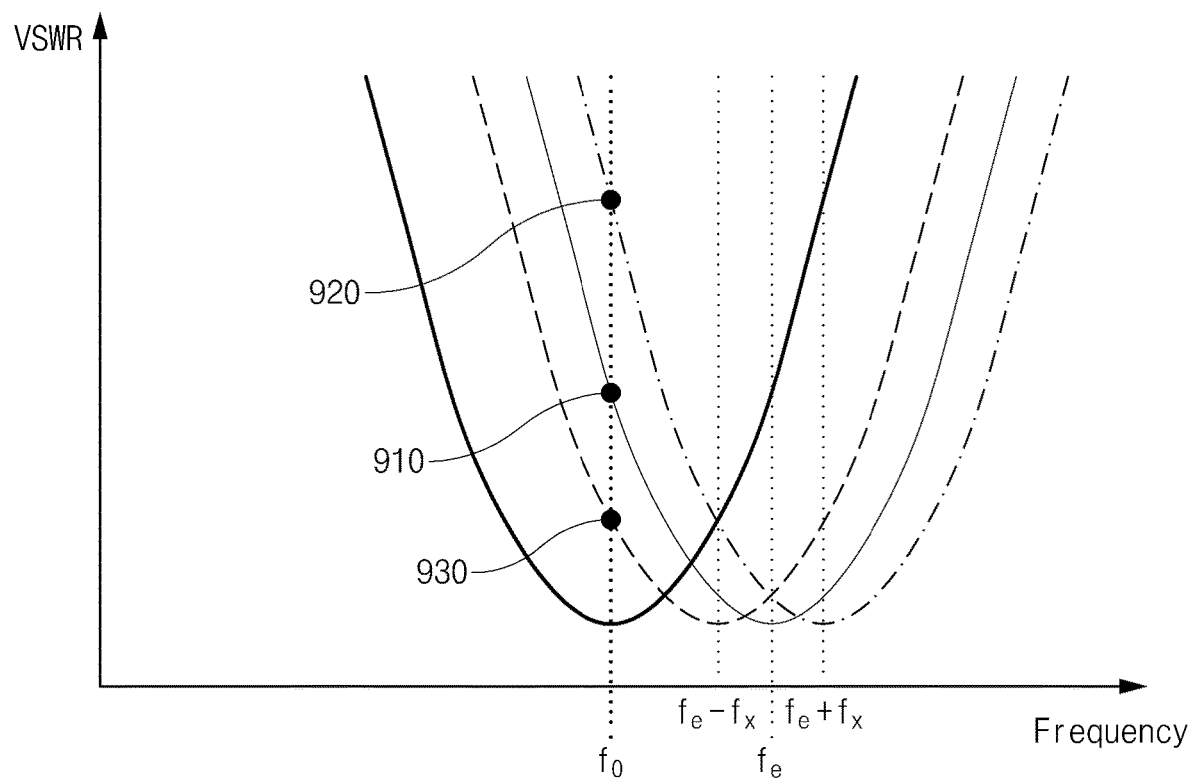
FIG. 9 is a graph illustrating a VSWR as a function of frequency of an antenna in an electronic device, according to an embodiment of the present disclosure.

FIG. 9 is a graph illustrating a VSWR as a function of a frequency of an antenna in an electronic device, according to an embodiment of the present disclosure.

Referring to FIG. 9, if an external cause (e.g., the change in the position of the hand of the user or the change in the state of the medium) is changed after the electronic device controls the tunable element to have the time constant corresponding to the fifth VSWR 820 as described above, the resonant frequency of the radiating portion included in the electronic device may be shifted to a seventh frequency ($f_e$) due to the change of the external cause. The electronic device may calculate a seventh VSWR 910 based on the strength of the signal and the strength of the reflected signal, when transmitting the signal at the specified frequency ($f_o$).

According to an embodiment of the present disclosure, the electronic device may adjust the time constant of the tunable element such that the resonant frequency of the electronic device is shifted to an eighth frequency ($f_e+f_x$) which is higher than the seventh frequency ($f_e$) after calculating the seventh VSWR 910. The electronic device may calculate an eighth VSWR 920 based on the strength of the signal and the strength of the reflected signal, when transmitting the signal at the specified frequency ($f_o$) after adjusting the time constant of the tunable element.

According to an embodiment of the present disclosure, the electronic device may adjust the time constant of the tunable element such that the resonant frequency of the electronic device is shifted to a ninth frequency ($f_e-f_x$) which is lower than the seventh frequency ($f_e$) after calculating the eighth VSWR 920. The electronic device may calculate a ninth VSWR 930 based on the strength of the signal and the strength of the reflected signal, when transmitting the signal at the specified frequency ($f_o$) after adjusting the time constant of the tunable element.

According to an embodiment of the present disclosure, the electronic device may compare the seventh VSWR 910, the eighth VSWR 920, and the ninth VSWR 930. The electronic device may control the tunable element to have a time constant corresponding to the ninth VSWR 930 which is the smallest one among the seventh VSWR 910, the eighth VSWR 920, and the ninth VSWR 930. As described above, even though the external factors are varied, the VSWR may be gradually lowered and the radiation performance of the radiating portion may be gradually improved by continuously adjusting the time constant of the tunable element based on the VSWR.

Figure 10:
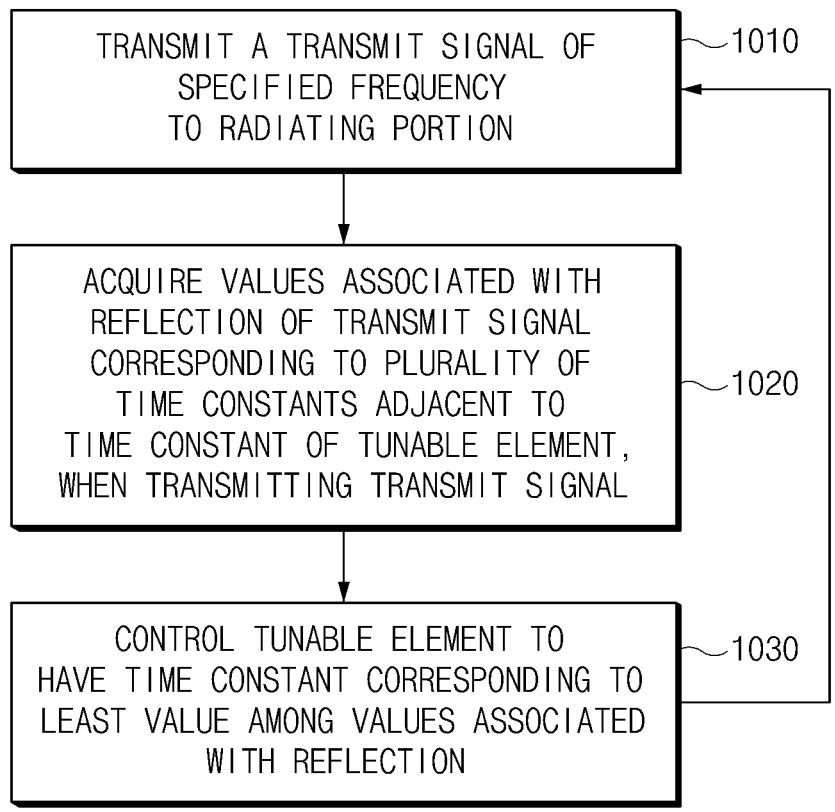
FIG. 10 is a flowchart illustrating a method for tuning an antenna in an electronic device, according to an embodiment of the present disclosure.

FIG. 10 is a flowchart illustrating a method for tuning an antenna in an electronic device, according to an embodiment of the present disclosure.

The following description will be made on the assumption that the electronic device 600 performs the process illustrated in FIG. 10. Further, in the following description made with reference to FIG. 10, it is understood that the operations described as being performed by the electronic device are controlled by the communication processor 615 or the application processor 610.

Referring to FIG. 10, in step 1010, the electronic device may transmit a signal at a specified frequency to a radiating portion. The electronic device may transmit the signal to the radiating portion designed to make resonance at the specified frequency to radiate the signal.

In step 1020, the electronic device may acquire values associated with the reflection of the signal corresponding to a plurality of time constants adjacent to the time constant of the tunable element, when transmitting the signal. The tunable element may be controlled to have one of the plurality of time constants which are specified by the electronic device. The electronic device may acquire a first value associated with the reflection of the signal without adjusting the time constant of the tunable element when transmitting the signal. After acquiring the first value, the electronic device may control the tunable element to have a time constant greater than a time constant corresponding to the first value and adjacent to the time constant corresponding to the first value and may acquire a second value associated with the reflection of the signal. After acquiring the second value, the electronic device may control the tunable element to have a time constant less than a time constant corresponding to the first value and adjacent to the time constant corresponding to the first value and may acquire a third value associated with the reflection of the signal.

In step 1030, the electronic device may control the tunable element to have a time constant corresponding to the smallest value among the values associated with the reflection. The electronic device may control the tunable element to have the time constant corresponding to the smallest value among the first value, the second value, and the third value.

Figure 11:
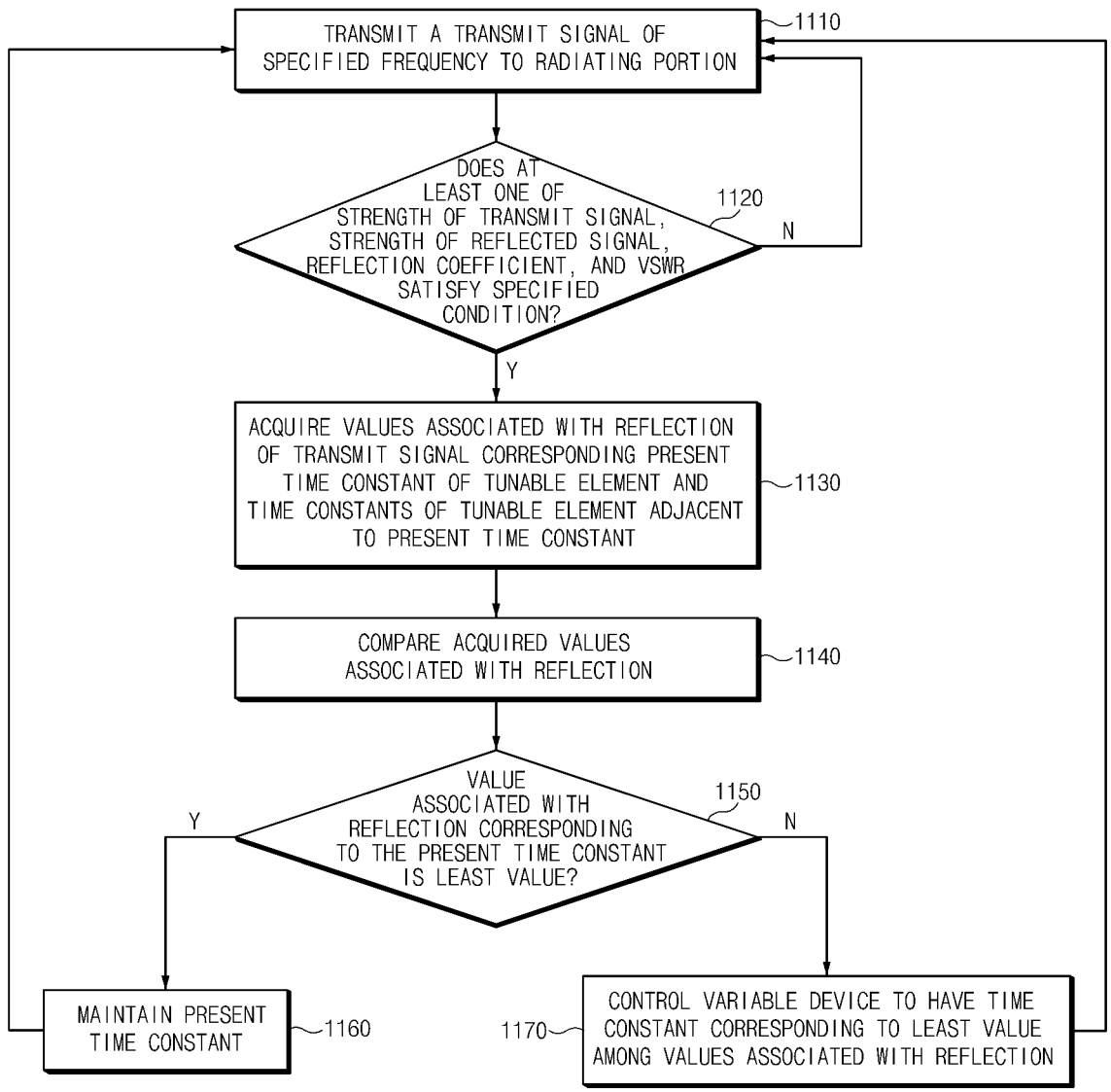
FIG. 11 is a flowchart illustrating a method for tuning an antenna in an electronic device, according to an embodiment of the present disclosure.

FIG. 11 is a flowchart illustrating the method for tuning the antenna in the electronic device, according to an embodiment of the present disclosure.

The following description will be made on the assumption that an electronic device 600 performs the process illustrated in FIG. 11. Further, in the following description made with reference to FIG. 11, it is understood that the operations described as being performed by the electronic device are controlled by the communication processor 615 or the application processor 610. Hereinafter, the redundant details of operations similar to the operations described with reference to FIG. 10 will be omitted.

In step 1110, the electronic device may transmit a signal at a specified frequency to a radiating portion.

In step 1120, the electronic device may determine whether at least one of the strength of a signal, the strength of a reflected signal, a reflection coefficient, and a VSWR satisfies a specified condition. The electronic device may determine the specified condition to be satisfied if the reflection coefficient or the VSWR is increased in excess of a specified range. If the reflection coefficient or the VSWR is changed in excess of the specified range, the electronic device may determine the radiation efficiency to be degraded due to the frequency shift of the antenna and may perform the operations to be described below. The electronic device may continuously monitor the strength of the signal, the strength of the reflected signal, the reflection coefficient and/or the VSWR until the specified condition is satisfied. If none of the strength of a signal, the strength of a reflected signal, a reflection coefficient, and a VSWR satisfies a specified condition, then step 1110 may be executed. If the strength of a signal, the strength of a reflected signal, a reflection coefficient, and a VSWR satisfies a specified condition, then step 1130 may be executed.

In step 1130, the electronic device may acquire values associated with the reflection of the signal corresponding to a present time constant of a tunable element and time constants of the tunable element adjacent to the present time constant. The electronic device may acquire a first VSWR corresponding to the present time constant of the tunable element. The electronic device may tune the time constant of the tunable element to raise the resonant frequency of the radiating portion after acquiring the first VSWR. The electronic device may acquire a second VSWR corresponding to the tuned time constant if the tunable element is tuned. The electronic device may tune the time constant of the tunable element to reduce the resonant frequency of the radiating portion after acquiring the second VSWR. The electronic device may acquire a third VSWR corresponding to the tuned time constant if the tunable element is tuned.

In step 1140, the electronic device may compare the acquired values associated with the reflection together. The electronic device may compare the first VSWR, the second VSWR, and the third VSWR together.

In step 1150, the electronic device may determine whether the value associated with the reflection corresponding to the present time constant is the smallest value. The electronic device may determine whether the first VSWR is less than the second VSWR and the third VSWR.

If the value associated with the reflection corresponding to the present time constant is the smallest value, the electronic device may maintain the present time constant in step 1160. The electronic device may maintain the present time constant if the first VSWR is the smallest VSWR. Thereafter, the electronic device may repeat steps 1110 to step 1150.

If the value associated with the reflection corresponding to the present time constant is not the smallest value, the electronic device may control the tunable element to have the time constant corresponding to the smallest value among the values associated with the reflection, in step 1170. The electronic device may control the tunable element to have a time constant corresponding to the second VSWR if the second VSWR is the smallest VSWR, or may control the tunable element to have the time constant corresponding to the third VSWR if the third VSWR is the smallest VSWR. Thereafter, the electronic device may repeat steps 1110 to step 1150 based on the time constant corresponding to the second VSWR or the time constant corresponding to the third VSWR.

The term "module" used in the present disclosure may include a unit composed of hardware, software and firmware and may be interchangeably used with the terms "unit", "logic", "logical block", "component" and "circuit". The "module" may be an integrated component or may be a minimum unit for performing one or more functions or a part thereof. The "module" may be implemented mechanically or electronically and may include an application specific IC (ASIC) chip, a field programmable gate array (FPGA), and a programmable logic device for performing some operations, which are known or will be developed.

At least a part of an apparatus (e.g., modules or functions thereof) or a method (e.g., operations) according to various embodiments of the present disclosure may be implemented by commands stored in computer-readable storage media (e.g., the memory 130) in the form of a program module. The instruction, when executed by a processor (e.g., the processor 120), may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a DVD, a magneto-optical media (e.g., a floptical disk)), and an internal memory. Also, a program instruction may include not only assembly code such as things generated by a compiler but also a high-level language code executable on a computer using an interpreter. A module or a program module may include at least one of the above elements, or a part of the above elements may be omitted, or other elements may be further included. Operations performed by a module, a program module, or other elements may be executed sequentially, in parallel, repeatedly, or in a heuristic method or some operations may be executed in different sequences or may be omitted. Alternatively, other operations may be added.

While the present disclosure has been shown and described with reference to various embodiments of the present disclosure thereof, it will be understood by those skilled in the art that various changes in form and details may be made therein without departing from the spirit and scope of the present disclosure as defined by the appended claims and their equivalents.

What is claimed is:

1. An electronic device comprising:
a radiating portion configured to radiate a signal at a specified frequency;
a feeding portion electrically connected with the radiating portion;
a tunable element electrically connected with one point of the radiating portion and configured to influence an electrical length of the radiating portion; and
a control circuit electrically connected with the radiating portion, the feeding portion, and the tunable element,
wherein the control circuit is configured to:
transmit a first signal at the specified frequency to the radiating portion through the feeding portion;
monitor the first signal, a second signal reflected from the radiating portion, or a first voltage standing wave ratio (VSWR) associated with the first signal and the second signal while the first signal is transmitted through the radiating portion;
determine a radiation efficiency to degrade due to a frequency shift of the radiating portion, if at least one of strength of the first signal, strength of the second signal, or the first VSWR satisfies a specified condition;
acquire first values associated with reflection of the first signal corresponding to a first time constant of the tunable element and a plurality of time constants adjacent to the first time constant of the tunable element;
control the tunable element to have a second time constant corresponding to a smallest value among the first values associated with the reflection of the first signal;
transmit a third signal to the radiating portion through the feeding portion when the tunable element is controlled to have the second time constant;
acquire second values associated with reflection of the third signal corresponding to the second time constant of the tunable element and a plurality of time constants adjacent to the second time constant of the tunable element, if at least one of strength of the third signal, strength of a fourth signal reflected from the radiating portion while the third signal is transmitted through the radiating portion, or a second VSWR associated with the third signal and the fourth signal satisfies the specified condition, and
control the tunable element to have a third time constant corresponding to a smallest value among the second values associated with the reflection of the third signal.

2. The electronic device of claim 1, further comprising:
a coupler configured to transmit, to the control circuit, at least a part of the first signal, at least a part of the second signal at least a part of the third signal and at least a part of the fourth signal.

3. The electronic device of claim 1, wherein the control circuit includes at least one of an application processor and a communication processor.

4. The electronic device of claim 1, wherein the tunable element includes a switch tunable element, a complementary metal-oxide semiconductor (CMOS) tunable element, a micro electro mechanical system (MEMS) tunable element, or a dielectric tunable element.

5. The electronic device of claim 1, wherein the control circuit is further configured to:
control the tunable element to have one of a plurality of specified time constants.

6. The electronic device of claim 5, wherein the control circuit is further configured to:
acquire a first measured value associated with the reflection corresponding to a first time constant of the tunable element, when transmitting a first specified signal;
control the tunable element to have a second specified time constant, which is greater than the first specified time constant and adjacent to the first specified time constant, among the plurality of specified time constants;
acquire a second measured value associated with the reflection corresponding to the second specified time constant;
control the tunable element to have a third specified time constant, which is less than the first specified time constant and adjacent to the first specified time constant, among the plurality of specified time constants; and
acquire a third measured value associated with the reflection corresponding to the third specified time constant.

7. The electronic device of claim 6, wherein the control circuit is further configured to:
control the tunable element to have a time constant corresponding to the smallest value among the first measured value, the second measured value, and the third measured value.

8. The electronic device of claim 5,
wherein the control circuit is configured to adjust a value of the tunable element to a first specified value and detect the strength of the second signal,
wherein the control circuit is configured to adjust a value of the tunable element to the second specified value corresponding to a change direction of a first specified value if a strength of the second signal is reduced, and
wherein if the first specified value is greater than the value of the tunable element before adjustment, the control circuit is configured to adjust the value of the tunable element to the second specified value which is greater than the first specified value, and if the first specified value is less than the value of the tunable element before adjustment, the control circuit is configured to adjust the value of the tunable element to the second specified value which is less than the first specified value.

9. The electronic device of claim 5,
wherein the control circuit is configured to adjust a value of the tunable element to a first specified value and detect the strength of the second signal,
wherein the control circuit is configured to adjust a value of the tunable element to the second specified value corresponding to a direction different from a change direction of a first specified value if the strength of the second signal is increased, and
wherein if the first specified value is greater than a value of the tunable element before adjustment, the control circuit is configured to adjust the value of the tunable element to the second specified value which is less than the first specified value, and if the first specified value is less than the value of the tunable element before adjustment, the control circuit is configured to adjust the value of the tunable element to the second specified value greater than the first specified value.

10. A method for adjusting an electrical length of a radiating portion of an electronic device including the radiating portion and a tunable element, the method comprising:

transmitting a first signal at a specified frequency to the radiating portion through the feeding portion;
monitoring the first signal, a second signal reflected from the radiating portion, or a first voltage standing wave ratio (VSWR) associated with the first signal and the second signal while the first signal is transmitted through the radiating portion;
determining a radiation efficiency to degrade due to a frequency shift of the radiating portion, if at least one of strength of the first signal, strength of the second signal, or the first VSWR satisfies a specified condition;
acquiring first values associated with reflection of the first signal corresponding to a first time constant of the tunable element and a plurality of time constants adjacent to the first time constant of the tunable element;
controlling the tunable element to have a second time constant corresponding to a smallest value among the first values associated with the reflection of the first signal;
transmitting a third signal to the radiating portion through the feeding portion when the tunable element is controlled to have the second time constant;
acquiring second values associated with reflection of the third signal corresponding to the second time constant of the tunable element and a plurality of time constants adjacent to the second time constant of the tunable element, if at least one of strength of the third signal, strength of a fourth signal reflected from the radiating portion while the third signal is transmitted through the radiating portion, or a second VSWR associated with the third signal and the fourth signal satisfies the specified condition; and
controlling the tunable element to have a third time constant corresponding to a smallest value among the second values associated with the reflection of the third signal.

* * * * *